(12) United States Patent
Pietilä

(10) Patent No.: US 6,750,894 B2
(45) Date of Patent: Jun. 15, 2004

(54) METHOD OF FORMING IMAGE ON SUPPORT

(76) Inventor: Urho A. Pietilä, Mikonkatu 25 D 62, FIN-00100 Helsinki (FI)

(*) Notice: Subject to any disclaimer, the term of this patent is extended or adjusted under 35 U.S.C. 154(b) by 0 days.

(21) Appl. No.: 10/168,535

(22) PCT Filed: Jan. 3, 2001

(86) PCT No.: PCT/FI01/00005

§ 371 (c)(1),
(2), (4) Date: Jul. 1, 2002

(87) PCT Pub. No.: WO01/50190

PCT Pub. Date: Jul. 12, 2001

(65) Prior Publication Data

US 2002/0192603 A1 Dec. 19, 2002

(30) Foreign Application Priority Data

Jan. 3, 2000 (FI) .............................................. 20000005
Aug. 28, 2000 (FI) .............................................. 20001892

(51) Int. Cl.$^7$ .............................. B41J 2/435; G03C 8/00
(52) U.S. Cl. ....................................... 347/224; 430/203
(58) Field of Search ................................ 347/224, 228, 347/212; 430/203, 204

(56) References Cited

U.S. PATENT DOCUMENTS

| | | | |
|---|---|---|---|
| 4,521,106 A | 6/1985 | Lambeth | .................... 356/3.07 |
| 6,180,315 B1 * | 1/2001 | Schadeli et al. | ............ 430/200 |

* cited by examiner

*Primary Examiner*—Hai Pham
(74) *Attorney, Agent, or Firm*—Armstrong, Kratz, Quintos, Hanson & Brooks, LLP

(57) ABSTRACT

The present invention relates to a method of recording an image of a given object onto a substrate. In the method, the object is first defined as the numerical image values at its coordinate locations and then, using these numerical values for control, the final image is recorded with the help of reactive agents capable of undergoing a change of state. Each one of the state-changing reactive agents is applied onto each point of the substrate in an amount located and controlled by the numerical value of the respective point in the object image, whereupon each one of the amounts of the applied agents is subjected to a reaction causing a change of state. The invention can be implemented to record photographic images, for instance. Other applications are in the manufacture of printed-circuit boards, printing plates and the like.

11 Claims, No Drawings

METHOD OF FORMING IMAGE ON SUPPORT

BACKGROUND OF THE INVENTION

1. Field of the Invention

The present invention relates to a method of recording an image of a given object onto a substrate.

2. Description of the Related Art

In the art is known a method of forming an image from an object by way of defining the object as a pixel set of digital values, and then forming the image onto a substrate under the control of the pixel set of digital values. The object image information is stored as the color/hue/intensity values of each pixel. The image is formed onto a substrate pre-coated with a layer of photoreactive material. Subsequently, the substrate can be exposed with the help of a point source of light (a laser) in a positionally deflected manner, whereby the light intensity is controlled at each pixel location to the value determined by the digital intensity value of the object at the respective point. To record a color image, values obtained from a color separation process are used to control a three-color laser.

The latent image thus formed is developed into a visible image by way of initiating a color-forming reaction in the photoreactive material, then fixing the image and finally treating the substrate by methods known in the art of photography. This kind of method may be used in the recording of a black-and-white or a color image.

To obtain the required digital image values, the object can be first imaged by a plurality of techniques known in the art, such as a direct photography of the object using a digital camera. Alternatively, the object may be first photographed in a conventional manner and the information content of the film image thus formed can be converted into a digital format by means of scanners generally used in the art.

In this conventional method of image reproduction, the image is produced through a traditional photographic process, wherein the fixing of the image is a crucial step. During fixing, a chemical treatment step is carried out to remove from the emulsion overlying the substrate that portion of the photoreactive agent whose composition has not changed under exposure into a form capable of reacting in a color-forming manner with the developing chemical. While this step represents a cost-increasing factor as an extra step of the process, it especially seriously adds to the chemical burden imposed by the process. The chemical waste burden does not only appear as an additional cost and an environmental burden, but its implicit effect also represents a significant risk to the finished image. Firstly, there inevitably remains into the developed image some amount of unreacted photoreactive material, developer residues and fixing chemical residues inasmuch such chemical residues in the printed image cannot be avoided in spite of the washing steps performed in the process. Eventually, these chemical residues deteriorate the long-term stability of the finished image.

BRIEF SUMMARY OF THE INVENTION

The method is based on an image transfer technique, wherein the object is first scanned to determine the numerical image values at its coordinate locations. Using these numerical values, the final image is then recorded with the help of reactive agents capable of undergoing a change of state. Advantageously, the reactive agent forming the image by a state change is a photoreactive agent, particularly advantageously an agent capable of undergoing a photoreactive conversion into a specific color, with the help of which the final image is recorded in a shape and color rendition that represent those of the original object.

It is an object of the present invention to provide a method capable of overcoming the above-described drawbacks of the related art.

The goal of the invention is achieved by way of first defining the object's numerical values (through digitization) and then recording the image of the object, with the help of reactive agents undergoing a state change, under the control of the predetermined numerical values. According to the general concept of the invention, the reactive agent capable of a state change is applied onto a substrate in amounts positioned and controlled by the numerical value associated with the respective coordinate location, whereupon the substrate can be subjected to a reaction resulting in the desired state change in each applied agent.

Particularly in image reproduction based on a state-change-causing reaction aiming to produce a specific color, the method according to the invention can record a high-quality image so that the color-forming reaction of each dye agent reproducing a specific color is brought to its complete end point. Hence, the recorded image cannot contain unreacted dye agent that would need to be removed by postprocessing. As a result, the image will contain an amount of chemical residues substantially smaller than what is encountered in a state-of-the-art process as to both the dye itself and the chemical required to remove its unreacted portion. This means that at least one workstep can be eliminated in the sequence of image processing, thus offering respective savings in work and material costs. Additionally, the long-term stability of the processed image becomes substantially superior over that of an image reproduced using a state-of-the-art process.

DETAIL DESCRIPTION OF THE PREFERRED EMBODIMENTS

As mentioned above, the first step in the implementation of the invention is to convert in a conventional manner the image information of the object into a digital format, either through digital imaging or by way of a precedent imaging technique. Such a precedent imaging technique may involve, e.g., photographic recording of the object image on a film, wherefrom the image information is transformed into a digital format with the help of an image converter, that is, a scanner, utilizing conventional techniques. The thus processed image information represents the object in pixel storage format so that each pixel of the object image contains defined therein the color component values and respective intensities at each pixel location.

Obviously, an image stored in a digital format can be subjected to intermediate processing by different methods known in the art.

The invention may be implemented in an advantageous manner using known kinds of photoreactive materials that are employed in the art of photography. In these materials, the photoreactive component is generally a silver halide mixed in a suitable matrix material (gelatin), whereby an emulsion is formed containing the photoreactive component. The physical qualities of the emulsion such as its rheology properties can be controlled in a conventional manner by way of selecting a proper matrix material and then modifying its properties with the help of additives, for instance. Also temperature level control can be used to affect the flowability and reactivity of the emulsion.

The substrate material, whereon the image is reproduced may be any material conventionally used in the art of photography and printing, such as paper, plastic, metal and the like substrate that can be subjected to a proper pretreatment required by the applied reactive component as is made by respective steps in the art of photography or printing. A technique of pretreating the substrate material that has been found advantageous comprises treating the substrate with the matrix material to be used in the emulsion containing the state-changingly reactive material, or with some other material compatible with the same, such as a binder, whereby adherence of the emulsion material applied in the image recording step can be improved to an excellent level. This approach also offers a possibility of adjusting the proportion of the matrix component in the emulsion containing the reactive material.

Advantageously, the equipment used for applying the state-changingly reactive material onto the substrate is based on ink-jet droplet deposition of the printing ink material, but also other known pixel-by-pixel controlled printing techniques can be used such as those based on an electrical force of attraction.

In the ink-jet printing technique, the application of the state-changingly reactive material can be controlled on the basis of the numerical values imaged from the object. As to the definition of image recording process, the essential factors are the dot size and spatial density of applied dots. The equipment used in the application of the state-changingly reactive material may be complemented with different kinds of auxiliary functions such as temperature control and mixing of the reactive material. According to an embodiment of the invention, the photoreactive material used in printing may be pre-exposed prior to its application onto the substrate, which means that the exposing means may be integrated with the ink application apparatus.

The image formed by application of the photoreactive material onto the substrate is a latent image meaning that the photoreactive material has been converted by an exposure into a form wherein it can undergo a reaction producing its specific color. In the processing of the latent image, the exposure of the photoreactive material is not critical in the same sense as in the exposure required in the conventional techniques. As the pixels have no excess amount of the photoreactive material, the exposure may be safely carried out as an overexposure thus assuring that all the photoreactive material is converted into a latent image form. In contrast, under-exposure must be avoided, because if not all the photoreactive material is not exposed, the formation of the latent image will remain incomplete.

The conventional technique of changing the latent image into a visible form, that is, conversion into the specific color of the photoreactive material takes place via a chemical reaction. In the art of photography, this step is known as development. For photoreactive materials based on silver halides, the developer must be a reducing agent. Obviously, the type of developer must be selected according to the kind of photoreactive material used.

Developing can be made in all the known fashions in a liquid phase, but also a developer carried in a steam or gas phase may be used. In terms of environmental burden, the latter techniques are preferred. After developing, the image is subjected to a normal washing step, complemented with conventional postprocessing steps such as glazing if necessary and coatings. The fixing step which is mandatory in a conventional photography process in order to remove unreacted excess amount of the photoreactive material can, however, be omitted in the method according to the invention.

The developer used to bring about the so-called explicit print may be incorporated in the coating preapplied onto the substrate, whereby the image will form immediately after the ink-jet application of the photoreactive material with the provision that the photoreactive material is pre-exposed or, alternatively, after the ink-jet application and exposure steps if the photoreactive material is not pre-exposed before the ink-jet application step.

The invention is also suited for use in techniques, wherein a photographic image is utilized in the control of a surface-treatment process such as etching. Examples of these processes can be taken from the manufacture of printing plates and printed-circuit boards. The method is also applicable to the generation of radiographic pictures.

A benefit of the present invention is appreciated in its basic concept that utilizes a state-change reaction, such as generation of a specific color at the molecular level, which gives a possibility of achieving a substantially improved image quality over conventional printing techniques based on ink-jet ejection of pigment colors. Moreover, an essential improvement is also attained in regard to prior-art color rendition techniques in the chemical purity of the formed image and, therethrough, in its long-term stability.

In many implementations of the invention, the state-changingly reactive material, whose application takes place in a digitally controlled manner, can be deposited in liquid form such as an emulsion, but depending on the choice of most appropriate deposition technique, the reactive material may also be applied in gas or steam phase with the provision that the positioning of the material onto the substrate is controlled with the help of a compatibly controlled deposition technique such as any of those based on an electrically controlled attraction force. Obviously, any combination of these deposition techniques may be used.

The basic concept of the invention may also be applied in conjunction with materials others than those having photoreactive or specific-color-producing properties with the provision that the chemical or physical state of such materials after their deposition onto a substrate can be changed by a chemical or physical treatment.

When the invention is implemented in conjunction with the manufacture of printed-circuit boards, it is advantageous to use a combination of compounds in a liquid or emulsion form, wherein one of the components is a molecular-level compound that, by means of a chemical reaction, advantageously a photochemical reaction, can be converted into a form having chemical affinity with conducting compounds. An example of such a compound is, for instance, a silver halide such as silver bromide embedded in a suitable matrix such as gelatin as is known from the art of photography. In more detail, the above first embodiment of invention is carried out by recording a printed-circuit pattern onto the printed-circuit substrate using a numerically controlled ink-jet deposition technique. If the reactive component is a silver halide, its chemical affinity is initiated by a photochemical reaction and finally the pattern is converted into metallic silver by a chemical reduction reaction. After washing, the board is placed in an electrolytic bath, wherein the conducting compound proper is electrolytically deposited onto the silver pattern developed onto the board surface. The electrolytic bath may have a composition containing a silver compound.

A second alternative embodiment of the invention in printed-circuit manufacture is to build on the prior-art masking technique based on photography. In this approach, a blank board, which is clad over its entire surface area by a conducting material such as copper, is subjected to chemical processing. In the method according to the invention, the circuit pattern is first printed, using ink-jet technology for instance, onto the clad surface. To produce such as a pattern, the material to be deposited is selected such that it can be converted after its application into a form capable of protecting the underlying conducting material during the workstep wherein the unprotected areas of the conducting cladding material is chemically removed from the board surface. The protective printed-circuit mask is advantageously applied using a photoreactive material such as a light-curable polymer.

A third alternative embodiment of the invention in printed-circuit manufacture may be carried out by first coating a circuit board substrate, such a blank polyester laminate, with a photoreactive emulsion having a protective film overlying the same, whereby the unexposed form of the emulsion has an adhesive nature. Next, the circuit pattern is deposited onto the protective film using a material that is opaque to light or at least can be made opaque. Such a patterning material can be, e.g., a silver halide emulsion, whereon the circuit pattern is formed as a latent image. The final circuit pattern is made opaque to light by developing the latent image by a reduction reaction of the silver halide.

Next, the circuit board substrate is exposed to convert the exposable portion of the photoreactive emulsion applied onto the substrate into a different state, wherein the emulsion loses its adhesive property. In contrast, the areas of the emulsion protected by the pattern of developed silver retain their adhesive property. Now these protected areas define the desired circuit pattern. Subsequently, the protective film can be peeled off from the surface of the circuit board substrate, whereby the thus defined areas of the emulsion remain on the printed-circuit substrate forming the circuit conductors as a pattern of tacky areas. Now, these surface areas may be treated with a finely pulverized dust of a conducting material, such as copper dust, which adheres to the tacky areas and provides a high-definition circuit pattern for final processing.

In the processing of lithography plates, the invention can be utilized along the same guidelines as those described above for the examples taken from the manufacture of printed-circuit boards, whereby an image preprocessed for printing can be formed directly onto a lithography plate/roll (in lithography) or, alternatively, it is possible to protect a plate to be processed for printing by virtue of the present method over the desired points of the image against etching chemicals as is necessary in the case of a flexographic printing process. Furthermore, the invention may be applied to transfer of an image onto a silk screen.

To make an offset printing plate, for instance, the invention permits the image to be recorded directly onto an untreated blank plate, whereon the printing image is deposited using a photoreactive material applied from an ink-jet printer. Herein, the image may be deposited using either a negative- or positive-acting emulsion, whereby the original image must be appropriately preprocessed in its digital format. An important step in the preparation of a printing plate is to make the surface of the plate hydrophobic over the printable areas, whereby this requirement can be fulfilled by adding a hydrophobizing component to the composition of the photoreactive material.

What is claimed is:

1. A method of recording an image of a given object onto a substrate, comprising
   first defining the object as numerical image values further comprising coordinate locations and then,
   recording the final image on the substrate in state-changing reactive agents capable of undergoing a change of state, by
   applying each one of said state-changing reactive agents onto each point of said substrate in an amount according to a numerical image value at the respective corresponding point in the object image, and
   subjecting each one of said amounts of said applied agents to a reaction causing a change of state of all of the reactive agents.

2. The method according to claim 1, characterized in that at least one of said state-changing reactive agents is a photoreactive agent.

3. The method according to claim 1 or 2, characterized in that at least one of said state-changing reactive agents is an agent capable of undergoing a photoreactive conversion into a specific color.

4. The method according to claim 2, characterized in that said state-changing reactive agent is exposed after its application onto the substrate.

5. The method according to claim 2, characterized in that said state-changing reactive agent is exposed prior to its application onto the substrate.

6. The method according to any one of claims 2, 4 or 5, characterized in that said change of state is accomplished by means of treating the recorded latent image with a chemical composition.

7. The method according to claim 1, wherein said step of applying comprises applying the reactive agents in a variable density at the point.

8. A method of recording an image of a given object onto a substrate, comprising steps of:
   preapplying a composition to the substrate;
   defining the object as numerical image values further comprising coordinate locations; and finally
   recording the image on the substrate in state-changing reactive agents capable of undergoing a change of state, by applying each one of said state-changing reactive agents onto each coordinate location on said substrate in an amount according to a numerical image value at the respective corresponding coordinate location in the object image,
   subjecting each one of said amounts of said applied agents to a reaction causing a change of state; wherein
   said reaction is accomplished by means of the composition preapplied to the substrate.

9. The method according to claim 8, characterized in that at least one of said state-changing reactive agents is photoreactive agent.

10. The method according to claim 8, characterized in that said state-changing reactive agent is exposed after its application onto the substrate.

11. The method according to claim 8, characterized in that said state-changing reactive agent is exposed prior to its application onto the substrate.

* * * * *